United States Patent [19]

Sugishima et al.

[11] Patent Number: 4,684,315

[45] Date of Patent: Aug. 4, 1987

[54] FRICTIONLESS SUPPORTING APPARATUS

[75] Inventors: Kenji Sugishima, Kawasaki; Hiroshi Yasuda, Yokohama, both of Japan

[73] Assignee: Fujitsu Limited, Kanagawa, Japan

[21] Appl. No.: 824,930

[22] Filed: Jan. 31, 1986

Related U.S. Application Data

[63] Continuation of Ser. No. 537,626, Sep. 30, 1983, abandoned.

[30] Foreign Application Priority Data

Sep. 30, 1982 [JP] Japan ................ 57-171243

[51] Int. Cl.$^4$ .................. B23Q 1/26; G21K 5/10
[52] U.S. Cl. .................. 414/749; 250/442.1; 269/73; 310/90.5; 414/676
[58] Field of Search ............. 414/676, 749; 104/281, 104/283, 286; 269/73; 310/90.5

[56] References Cited

U.S. PATENT DOCUMENTS

| | | | |
|---|---|---|---|
| 2,916,279 | 12/1959 | Stanton | 310/90.5 X |
| 3,441,331 | 4/1969 | Kesling | 308/10 X |
| 3,493,274 | 2/1970 | Emslie et al. | 310/90.5 |
| 3,895,585 | 7/1975 | Schwärzler | 104/281 X |
| 4,129,291 | 12/1978 | Kato et al. | 269/73 |
| 4,244,629 | 1/1981 | Habermann | 308/10 |
| 4,273,054 | 6/1981 | Yamashita et al. | 104/281 |

FOREIGN PATENT DOCUMENTS 2515181 4/1976 Fed. Rep. of Germany ...... 104/283

OTHER PUBLICATIONS

IBM Technical Disclosure Bulletin, vol. 19, No. 8 Jan. 1977.

*Primary Examiner*—Leslie J. Paperner
*Attorney, Agent, or Firm*—Armstrong, Nikaido, Marmelstein & Kubovcik

[57] ABSTRACT

A frictionless supporting apparatus comprising a horizontally plane working table having magnet portions on its peripheries. Pairs of stationary magnets define therebetween a vertical space into which the working table is inserted. Magnetic repulsion between the magnet portions of the working table and the pairs of stationary magnets frictionlessly hold the working table between the pairs of stationary magnets. The working table also has vertical guide portions made of magnets extending along a predetermined one horizontal direction. A plane auxiliary table is arranged substantially in parallel to the working table. A motor is mounted on the auxiliary table for moving the working table in the predetermined one horizontal direction with respect to the auxiliary table. Pairs of guide magnets are provided on the auxiliary table, defining therebetween a horizontal space into which the guide portions of the working table are inserted. Magnetic repulsion between the vertical guide portions of the working table and the pairs of magnets of the auxiliary table frictionlessly guide the working table along the pairs of guide magnets, when the working table is moved in the predetermined one horizontal direction with respect to the auxiliary table. The auxiliary table is also frictionlessly supported and guided in a horizontal direction perpendicular to the predetermined direction with respect to the stationary base.

3 Claims, 8 Drawing Figures

FRICTIONLESS SUPPORTING APPARATUS

This application is a continuation of application Ser. No. 537,626 filed Sept. 30, 1983, now abandoned.

BACKGROUND OF THE INVENTION

1. Field of the Invention

This invention relates to a frictionless supporting apparatus, more particularly to such an apparatus for movably supporting a working table which may be used, for example, in a vacuum chamber of an electron beam exposure installation.

2. Description of the Prior Art

Electron beam exposure installations have vacuum chambers within which are disposed working tables movable in a horizontal X- and horizontal Y-direction. These "X-Y tables" carry samples to be treated, such as wafers of semiconductors. Electron beams are suitably scanned or deflected onto the surface of the samples, while X-Y tables are contunuously moved.

Many proposals have been made for moving the working table in the X- and Y-directions with respect to a stage base. Well known among these is a step-and-repeat system. This system includes frame members having V-shaped guide grooves and bearings. The frame members move along the guide grooves, while the working table is repeatedly moved by steps in X- and Y-directions by a suitable actuator.

Also well known is a block guide system. This system includes blocks rigidly situated on a stationary base. The working table is provided with guide grooves for the above-mentioned blocks. The working table can be moved in the X- and Y-directions along the guide grooves.

The apparatuses for moving X-Y working tables according to such systems, however, have serious disadvantages. For example, it is difficult to smoothly move the working table at a high speed and in a precise step-and-repeat manner because of the large frictional coefficient between the V-shaped guide grooves and bearings or between the blocks and guide grooves formed in the working table. This leads to problems of reliability and durability, especially serious since the working table has to be moved in a vacuum chamber.

In order to solve these problems, proposals have been made for frictionless supporting apparatuses adapted for use in a vacuum chamber of an electron beam exposure installation. These include gas injection systems for floating and frictionless supporting a working table while it is moved in the X- and Y-directions. Such systems have many advantages, for example, high reliability and substantially permanent durability. The apparatuses for such systems, however, require precisely machined parts, which increases the apparatus costs. The apparatuses are also large in size and require high running costs due to the large amount of gas, such as air or nitrogen ($N_2$), used in frictionlessly supporting the working table.

SUMMARY OF THE INVENTION

An object of the present invention is to provide a frictionless supporting apparatus adaptable for movably supporting a working table in X- and Y-directions within a vacuum chamber of an electron beam exposure installation, and capable of overcoming the disadvantages mentioned above.

Another object of the present invention is to provide a frictionless supporting apparatus without using a system for injecting air, nitrogen ($N_2$), or other gases.

Accoding to an aspect of the present invention, there is provided a frictionless supporting apparatus comprising: a horizontally plane working table; a means for moving the working table in at least one predetermined horizontal direction; and a means for supporting the working table. The supporting means comprises: magnetized horizontal portions on peripheries of the working table, first pairs of stationary magnetized members defining therebetween a vertical space into which the magnetized portions of the working table are inserted. The magnetic repulsion between the magnetized horizontal portions of the working table and the first pairs of stationary magnetized members, frictionlessly hold the working table between the first pairs of stationary magnetized members. Magnetized vertical guide portions extending along the predetermined direction are also provided on the working table.

The supporting means further comprises second pairs of stationary magnetized members defining therebetween a horizontal space into which the magnetized vertical guide portions of the working table are inserted. The magnetic repulsion between the magnetized vertical portions of the working table and the second pairs of stationary magnetized members frictionlessly guide the working table along the second pairs of stationary magnetized members, when the working table is moved in the predetermined direction. A means for injecting pressurized gas toward the working table can also be provided in order to additionally support the same.

According to another aspect of the present invention, there is provided a frictionless supporting apparatus comprising: a horizontally plane working table having magnetized horizontal portions on peripheries thereof; first parts of stationary magnetized members defining therebetween a vertical space into which the magnetized portions of the working table are inserted, such that magnetic repulsion between the magnetized horizontal portions of the working table and the first pairs of stationary magnetized members frictionlessly hold the working table between the first pairs of stationary magnetized members; said working table also having first magnetized vertical guide portions extending along a predetermined one horizontal direction; a plane auxiliary table arranged substantially parallel to the working table; a means mounted on the auxiliary table for moving the working table in the predetermined one horizontal direction with respect to the auxiliary table; second pairs of magnetized members provided on the auxiliary table and defining therebetween a horizontal space into which the first magnetized vertical guide portions of the working table are inserted, such that magnetic repulsion between the first magnetized vertical guide portions of the working table and the second pairs of magnetized members of the auxiliary member frictionlessly guide the working table along the second pairs of magnetized members when the working table is moved in the predetermined one horizontal direction with respect to the auxiliary table; said auxiliary table having second magnetized vertical guide portions extending along another horizontal direction perpendicular to the predetermined one horizontal directin; a means mounted one a stationary base for moving the auxiliary table in other horizontal direction; and third pairs of stationary magnetized members defining a horizontal space into which the second magnetized vertical guide portions of the auxiliary table are inserted, such that magnetic repulsion between the second magnetized vertical guide portions of the auxiliary table and the third pairs of stationary magnetized members frictionlessly guide the auxiliary table along the third pairs of stationary magnetized members, when the auxiliary table is moved in the other horizontal direction.

DESCRIPTION OF THE PREFERRED EMBODIMENTS

Before describing the preferred embodiments, an explanation will be given of prior art examples for reference.

Figure 1:
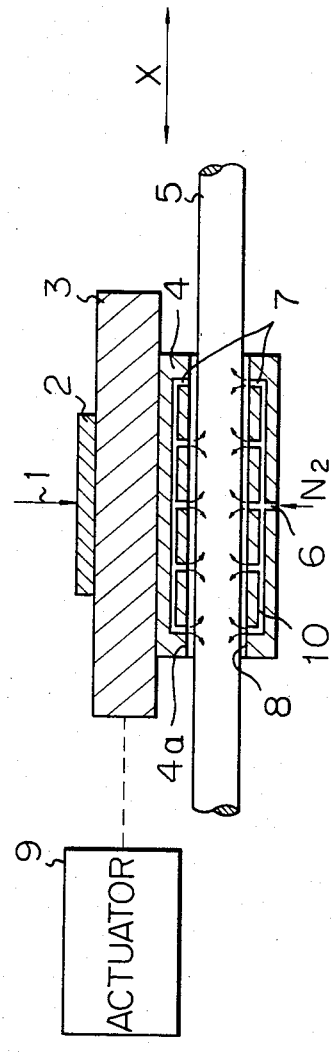
FIG. 1 is a longitudinal cross-sectional view illustrating a bearing portion of an example of a frictionless supporting apparatus known in the prior art.

In FIG. 1, a bearing portion of a conventionally known frictionless supporting apparatus is illustrated. An electron beam 1 is applied or irradiated to a sample 2 to be treated, such as a wafer of a semiconductor. The sample 2 is placed on a working table 3, which is moved in the X-direction (or Y-direction) by means of a table moving actuator 9. Under the working table 3, there is a bearing block 4 rigidly attached thereto, which is movable in the X-direction (or Y-direction) along guide bars 5. Although only a single bar 5 illustrated in FIG. 1, it should be understood that a plurality of guide bars 5 are arranged in parallel to each other. The bearing block 4 has corresponding guide slot 4a into which the guide bars 5 are inserted. The bearing block 4 also has a plurality of apertures 7 which are perpendicular to the guide slot 4a and opened to the inside thereof so as to form a plurality of gas jet nozzles. These apertures 7 are connected to a gas inlet port 6 via branch ports 10.

Pressurized gas, such as nitrogen ($N_2$), is supplied from the gas inlet 6 to the apertures 7 via the branch ports 10 and injected toward the guide bars 5, thereby floating and frictionlessly supporting the working table 3 together with the bearing block 4 while the working table 3 is moved in the X-direction (or Y-direction) by means of the actuator 9.

Figure 2:
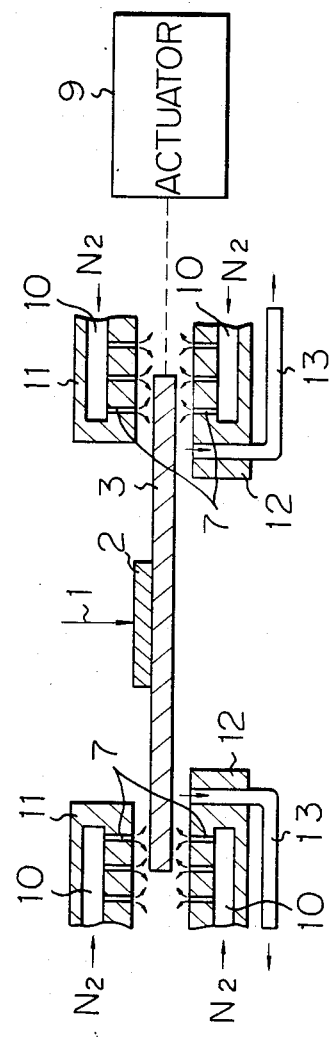
FIG. 2 is a schematic cross-sectional view illustrating a main portion of another example of a frictionless supporting apparatus known in the prior art.

FIG. 2 shows a conventionally known improved type of frictionless supporting apparatus using an air bearing system as illustrated in FIG. 1. In FIG. 2, a flat rectangular shaped working table 3 on which is placed a sample 2 to be treated is floated or frictionlessly supported by air injection devices 11 and 12 which are arranged at the peripheries of the working table 3 and above and under the same, respectively. Pressurized gas, such as nitrogen ($N_2$), is injected from a plurality of nozzles defined in apertures 7 formed in the air injection devices 11 and 12 toward the peripheries of the working table 3 so that the working table 3 is floated and frictionlessly supported in a portion between the air injection devices 11 and 12 with gaps between the working table 3 and the corresponding faces of the devices 11 and 12, respectively. In this case, pressurized gas is also introduced to the devices 11 and 12 via branch ports 10. The working table 3 can be moved in either the X-direction or Y-direction by means of table actuators 9, although FIG. 2 only illustrates an actuator for moving it in the X-direction. Exhaust ports 13 serve to discharge the nitrogen ($N_2$) gas after having used for floating the working table in order to maintain the inside of a working chamber, not shown, in a vacuum or negative pressure condition.

Figure 3:
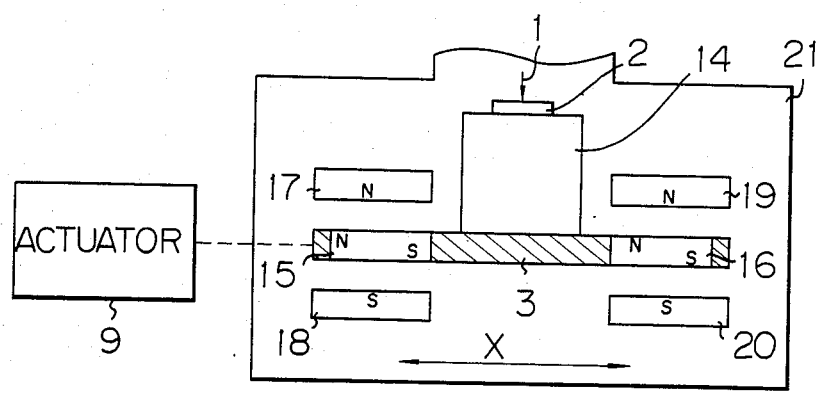
FIG. 3 is a schematic illustration for better understanding a principle of floating according to the present invention.
Figure 4:
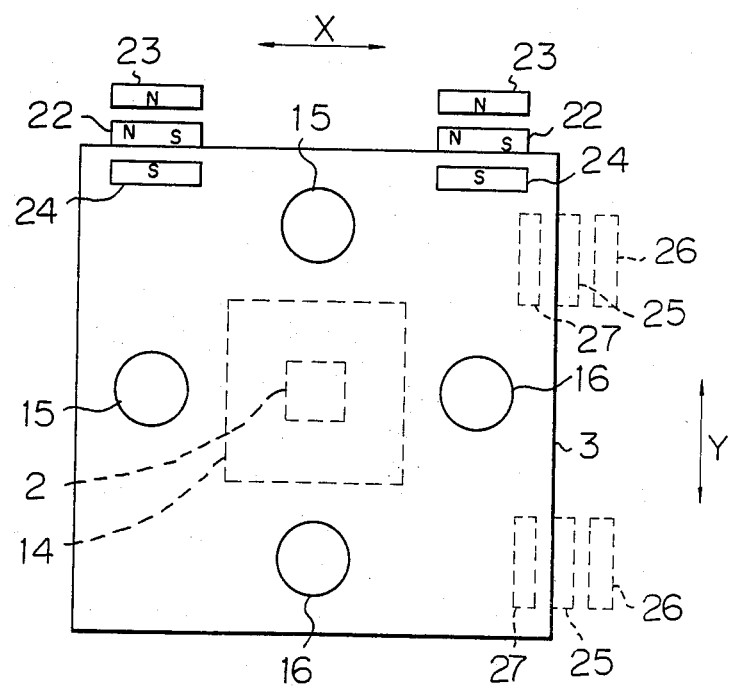
FIG. 4 is a top plan view of a working table which is used in the apparatus shown in FIG. 3.

Referring now to FIGS. 3 and 4, a frictionless supporting apparatus according to the present invention is schematically illustrated. This is also a part of an electron beam exposure installation, in which an electrons beam 1 is irradiated or applied to the upper surface of a sample 2 to be treated, such as a wafer of a semiconductor, placed on a holder member 14 which is fixed on a working table 3, which can be moved in the X-direction (or Y-direction) by means of a table moving actuator 9. The actuator 9 may be an electric motor, hydraulic cylinder, or the like. The sample 2 may be appropriately treated, such as, shaved, cut, or hardened, by the exposure or application of an electron beam.

The working table 3, which is substantially plane rectangular shaped, is substantially horizontally positioned between upper and lower magnets 17 and 18 and between upper and lower magnets 19 and 20 which are stationarily arranged at the peripheries of the working table 3 and above and under the same, respectively, in a working chamber 21. The working table 3 is also provided with magnet portions 15 and 16 on the peripheries thereof, such that these magnet portions 15 and 16 are inserted into a vertical space defined between the upper and lower magnets 17, 18 and 19, 20. These magnets 15, 16, 17, 18, 19, and 20 are so arranged that adjacent faces of magnets are the same poles and magnetic repulsion is exerted between the magnet portions 15 and 16 and the upper magnets 17 and 19, and between the magnet portions 15 and 16 and the lower magnets 18 and 20, respectively. Therefore, the working table 3 is floated and frictionlessly supported by virtue of magnetic force so as to leave gaps between adjacent magnets or magnet portions.

As clearly seen from FIG. 4, the working table 3 also has vertical guide portions 22 extending along the moving direction thereof, i.e., X direction in the instant case. These guide portions 22 are inserted into a horizontal space which is defined between magnets 23 and 24 rigidly attached to the stationary base in the vacuum chamber 21. The guide portions 22 are also made of magnets, such that adjacent faces of magnets are the same poles and magnetic repulsion is exerted between the guide portions 22 and magnets 23 and between the guide portions 22 and magnets 24, respectively. Therefore, the working table 3 is frictionlessly guided along the stationary magnets 23 and 24 with gaps between the adjacent magnets 22 and 23 and between the adjacent magnets 22 and 24, while the working table 3 is frictionlessly moved in the X-direction by the table actuator 9. Magnets 25, 26, and 27 corresponding to the magnets 22, 23, and 24, respectively can be provided in place of the latter in case of moving the table 3 in the Y-direction.

Figure 5:
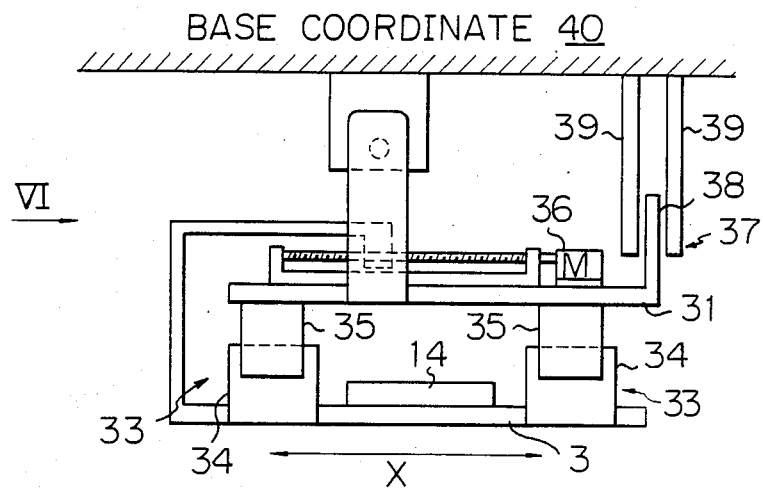
FIG. 5 is a schematic front elevational view of an apparatus for frictionlessly supporting a working table capable of moving in X- and Y-directions according to the present invention.
Figure 6:
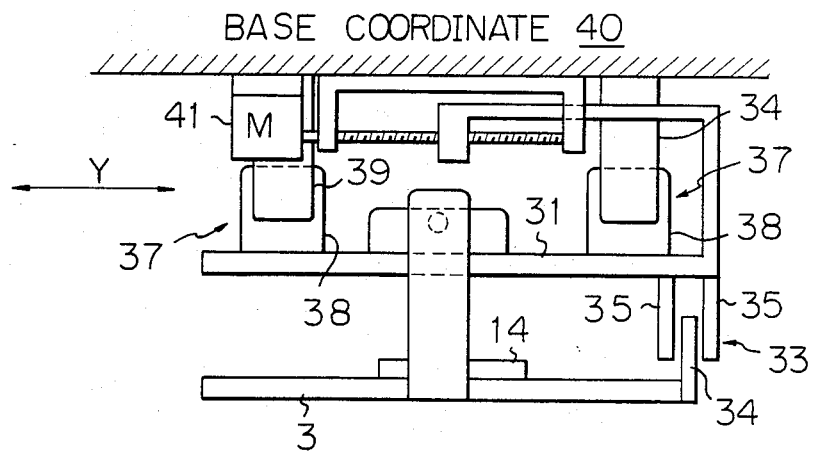
FIG. 6 is a schematic side elevational view of the apparatus of the present invention seen from an arrow VI in FIG. 5.

Referring now to FIGS. 5 and 6, a frictionless supporting apparatus including a working table capable of moving in both the X- and Y-directions is schematically illustrated. In this embodiment, a substantially rectangular and plane horizontal working table 1 is horizontally guided and frictionlessly supported in the same manner as the previous embodiment, i.e., the magnets 15, 16, 17, 18, 19, and 20 of FIG. 3, although those magnets are not shown in FIGS. 5 and 6. In this case, however, the working table is movable in the X- and Y-direction.

In this embodiment, more frictionless guide means are used than in the previous embodiment, which guide means comprise at least one magnet and at least a pair of guide magnets defining therebetween a space into which the first mentioned magnet is inserted, such that magnetic repulsion is exerted between the magnet and one of the pair of guide magnets and between the same magnet and the other of the pair of guide magnets, respectively, as also mentioned in the previous embodiment.

A plane auxiliary table 31 is arranged above the working table 3 and substantially in parallel thereto. Between the working table 3 and the auxiliary table 31 frictionless guide means 33 comprising vertical magnets 34 attached to the working table 3 and pairs of guide magnets 35 attached to the auxiliary table 31 are provided, such that the working table 3 is guided in the X-direction with respect to the auxiliary table 31, while the working table 3 is moved by a motor 36 mounted on the auxiliary table 31. The auxiliary table 31 is also horizontally guided and frictionlessly supported in the same manner as the previous embodiment, by the magnets 15, 16, 17, 18, 19, and 20 of FIG. 3, although they are not shown in FIG. 5 or FIG. 6. In this case, however, the auxiliary table 31 is guided in the Y-direction with respect to the stationary base. Consequently, a frictionless guide means 37 is provided between the auxiliary table 31 and the stationary base 40, wherein the guide means 37 comprises vertical magnets 38 attached to the auxiliary table 31 and pairs of guide magnets 39 attached to the stationary base 40, such that the auxiliary table 31 is guided in the Y-direction with respect to the stationary base 40, while the auxiliary table 31 is moved by a motor 41 mounted on the stationary base 40.

The working table 3 in this embodiment, thus, can be frictionlessly moved both in the X- and Y-directions by the motors 36 and 41. In this embodiment, the working table 3 is movable in a vacuum chamber, not shown, in the same manner as the previous embodiment.

Figure 7:
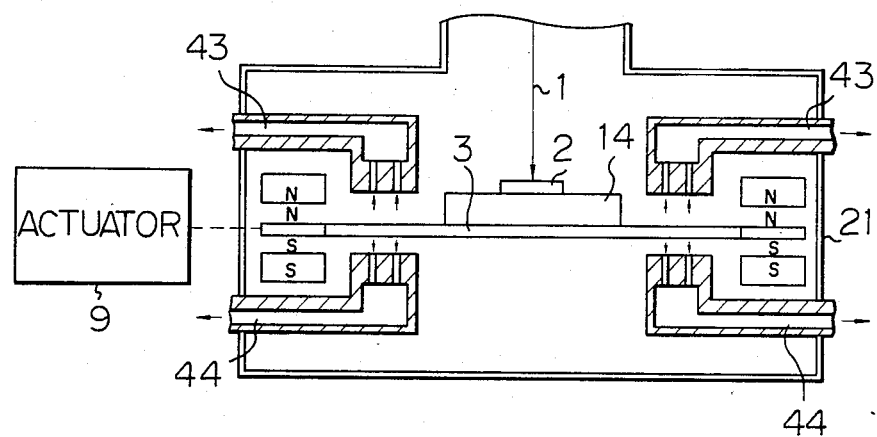
FIG. 7 is a schematic cross-sectional view another embodiment of a frictionless supporting apparatus according to the present invention.

In FIG. 7, there is shown an embodiment including additional vacuum means comprising upper and lower air suction nozzles 43 and 44 which are oppositely arranged above and below the working table 3, respectively. These nozzles 43 and 44 discharge gas from the chamber 21 to maintain it in a vacuum condition.

In the above embodiments, actuators for moving the working table 3 may be arranged either in the vacuum chamber 21 or outside of the same. The magnetized members may obviously be either permanent magnets or electomagnets.

Figure 8:
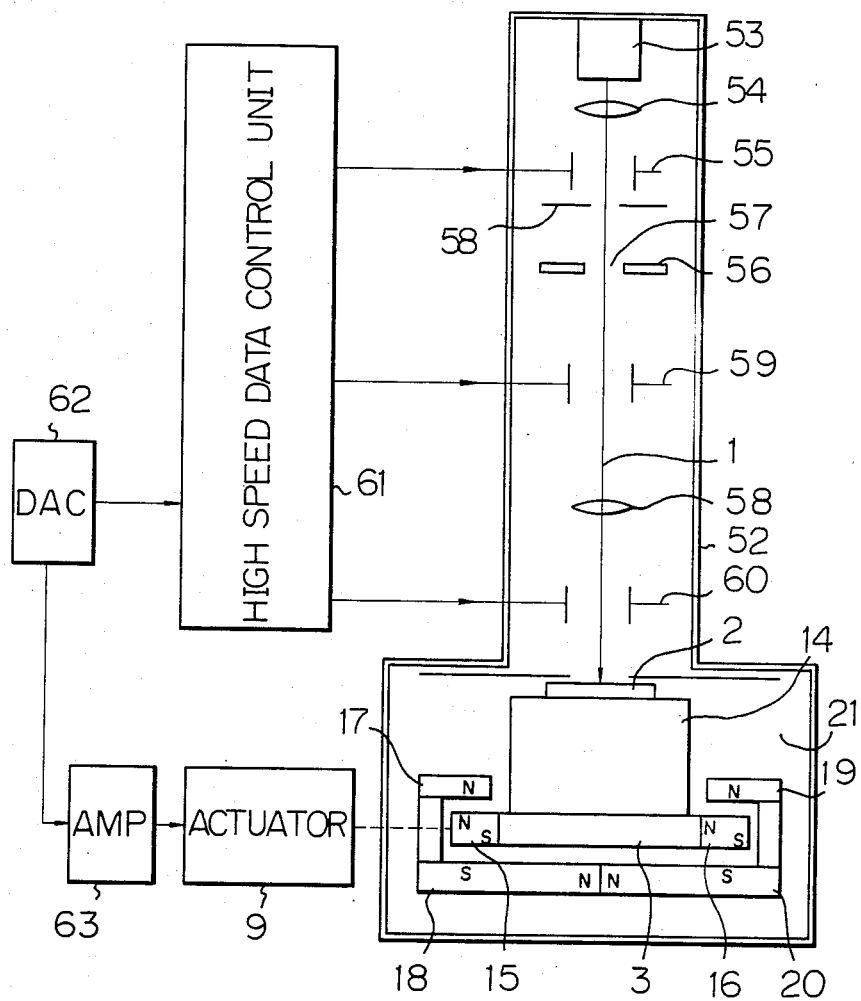
FIG. 8 is a schematic illustration of an electron beam exposure installation in which a frictionless supporting apparatus of the present invention is employed.

In FIG. 8, there is schematically illustrated an electron beam exposure installation including a frictionless supporting apparatus as described above. For simplification, the explanation will be made in reference to a fixed sectional shape of electron beam in which deflecting is separately exerted in divided large and small areas. In FIG. 8, an electron beam emitted from an electron gun 53 provided in a column 52 is exposed through a suitable condensing lens 54 on a mask plate 56 having, for instance, a rectangular shaped aperture 57. Upon passing through the rectangular shaped aperture 57, the electron beam becomes rectangular in its cross-section and is then forcused by a projection lens 58 to be exposed on a sample 2, such as a wafer of a semiconductor. Deflecting devices 59 and 60, each comprising a pair of deflecting coils, are connected to a control unit 61 for high speed data transmission. In the control unit 61, a position signal for scanning small areas and another position signal for designating prescribed large areas are read from the memory in a digital computer on the basis of already input data and given to the deflecting devices 59 and 60, respectively.

On the other hand, a time signal of beam shot is transmitted to a blanking deflecting device 55 from the above-mentioned high speed data control unit 61. The electron beam 1 emitted from the electron gun 53 is influenced by such a time signal so that it passes through an iris 58 disposed under the blanking deflecting device 55 in the non-deflected condition. When the time signal of beam shot is not applied, the electron beam is so widely deflected that it does not almost pass through the iris 58. Digital data from the high speed data control unit 61 is converted to analog data in a digital-to-analog converter 62, and the converted data is enlarged in an amplifier 63 to drive the working table moving actuator 63. In other words, the working table 3 is appropriately moved in the X- and/or Y-direction in accordance with the signal from the high speed data control unit 61, while the working table 3 carrying the sample 2 is frictionlessly supported in the vacuum chamber 21, as explained hereinbefore.

We claim:

1. A frictionless supporting apparatus used in a vacuum chamber of an electron beam exposure installation, said apparatus comprising:

a horizontally plane working table on which is placed a sample to be exposed by an electron beam, having magnetized horizontal portions on peripheries thereof;

first pairs of stationary magnetized members defining therebetween a vertical space into which said magnetized portions of the working table are inserted, such that magnetic repulsion between said magnetized horizontal portions of the working table and said first pairs of stationary magnetized members, frictionlessly hold said working table between said first pairs of stationary magnetized members;

said working table also having first magnetized vertical guide portions extending along a predetermined one horizontal direction;

a plane auxiliary table arranged substantially in parallel to said working table;

a means mounted on said auxiliary table for moving said working table in said predetermined one horizontal direction with respect to said auxiliary table;

second pairs of magnetized members provided on said auxiliary table and defining therebetween a horizontal space into which said first magnetized vertical guide portions of the working table are inserted, such that magnetic repulsion between said first magnetized vertical guide portions of the working table and said second pairs of magnetized members of the auxiliary member frictionlessly guide said working table along said second pairs of magnetized members, when the working table is moved in said predetermined one horizontal direction with respect to said auxiliary table;

said auxiliary table having second magnetized vertical guide portions extending along in another horizontal direction perpendicular to said predetermined one horizontal direction;

a means mounted on a stationary base for moving said auxiliary table in said other horizontal direction;

third pairs of stationary magnetized members defining a horizontal space into which said second magnetized vertical guide portions of the auxiliary table are inserted, such that magnetic repulsion between said second magnetized vertical guide portions of the auxiliary table and said third pairs of stationary magnetized members frictionlessly guide said auxiliary table along said third pairs of stationary magnetized members, when the auxiliary table is moved in said other horizontal direction.

2. An apparatus as set forth in claim 1, wherein said magnetized members comprise permanent magnets.

3. An apparatus as set forth in claim 1, wherein said magnetized members comprise electromagnets.

* * * * *